United States Patent [19]

Hayashi

[11] Patent Number: 5,017,858
[45] Date of Patent: May 21, 1991

[54] CONSTANT-CURRENT REGULATED POWER CIRCUIT

[75] Inventor: Shigeo Hayashi, Kanagawa, Japan

[73] Assignee: Sumitomo Electric Industries, Ltd., Osaka, Japan

[21] Appl. No.: 567,173

[22] Filed: Aug. 14, 1990

[30] Foreign Application Priority Data

Aug. 22, 1989 [JP] Japan .................................. 1-215781

[51] Int. Cl.⁵ ................................................. G05F 3/20
[52] U.S. Cl. ..................................... 323/316; 323/314
[58] Field of Search ............... 323/312, 313, 314, 315, 323/316; 307/296.1, 296.6, 296.7, 296.8

[56] References Cited

U.S. PATENT DOCUMENTS

| | | | |
|---|---|---|---|
| 4,079,308 | 3/1978 | Brown | 323/314 |
| 4,189,671 | 2/1980 | Yuen | 323/314 |
| 4,399,398 | 8/1983 | Wittlinger | 323/314 |
| 4,458,201 | 7/1984 | Koen | 323/317 |
| 4,684,880 | 8/1987 | Chan | 323/316 |
| 4,725,770 | 2/1988 | Okutsu et al. | 323/316 |
| 4,736,125 | 4/1988 | Yuen | 323/314 |
| 4,942,369 | 7/1990 | Nakagawara et al. | 323/316 |

Primary Examiner—Peter S. Wong
Attorney, Agent, or Firm—Cushman, Darby & Cushman

[57] ABSTRACT

A constant current regulated power circuit comprises first and second voltage sources; a bias circuit connected to the first and second voltage sources for sending out a predetermined output voltage, the bias circuit having an output terminal; first and second resistors; and a transistor having a base connected to the output terminal of the bias circuit, an emitter connected to the first voltage source through the first resistor and to the second voltage source through the second resistor, respectively, and a collector operating as an output terminal.

6 Claims, 4 Drawing Sheets

CONSTANT-CURRENT REGULATED POWER CIRCUIT

BACKGROUND OF THE INVENTION

1. Field of the Invention

The present invention relates to a constant-current regulated power circuit for use, for example, in an ECL (emitter coupled logic), or the like.

2. Prior Art

FIG. 1 shows an ECL circuit using a conventional constant-current regulated power circuit. The circuit is a differential amplifier circuit in which respective emitters of a pair of bipolar transistors $Q_6$ and $Q_7$ are connected to each other so that currents flowing in the transistors $Q_6$ and $Q_7$ are made to flow into a constant-current regulated power circuit 30. In this circuit, a bipolar transistor $Q_8$ is an emitter follower constituting an output stage. On the other hand, the constant-current circuit 30 includes a bias circuit 31 which is connected between the earth and a voltage source for supplying a voltage $V_{cc}$ so as to generate a predetermined voltage $V_o$ from the voltage supplied from the voltage source and the earth. The voltage $V_o$ is supplied to the base of a bipolar transistor $Q_1$. The collector of the transistor $Q_1$ is connected to the emitters of the transistors $Q_6$ and $Q_7$, and the emitter of the transistor $Q_1$ is connected to the earth through a resistor R.

In this circuit, a current I expressed in the following equation flows into the collector of the transistor $Q_1$ to which the voltage $V_o$ produced by the bias circuit 30 is supplied.

$$= \{h_{fe}/(1+h_{fe})\} \times \{(V_o - V_{BE})/R\} \quad (1)$$

As a result, a voltage $V_1$ produced from the emitter of the transistor $Q_8$ becomes as follows.

$$V_1 = V_{cc} - RI - V_{BE} \quad (2)$$

Here, when a temperature characteristic is necessary to the voltage $V_1$ depending on an external specification, necessary constants including $h_{fe}$, $V_{BE}$, and R are selected, and the bias circuit 31 for producing the suitable voltage $V_o$ is designed. That is, to what value (central value) of the output voltage $V_o$ of the bias circuit 31 be set on the assumption that the $V_{cc}$ does not fluctuate, to what degree a temperature factor be set, and to what degree the dependency on the $V_{cc}$ fluctuation be suppressed, become important problems.

In designing the conventional bias circuit taking the above problems into consideration, however, there is a problem that even if a bias circuit stable against changes in temperature can be provided, the bias circuit is extremely unstable against changes in the supply voltage $V_{cc}$.

Here, examples of the conventional bias circuit are shown in FIGS. 2(a) and 2(b) and FIG. 3. In the circuit shown in FIG. 2(a), a supply voltage $V_{cc}$ is lowered through a resistor $R_{41}$, the lowered voltage $V_o$ is supplied to a collector of a bipolar transistor $Q_{41}$ and is simultaneously divided by a resistor $R_{42}$ between the collector and base of the transistor $Q_{41}$ and a resistor $R_{43}$ between the base and emitter of the transistor $Q_{41}$ so as to cause a suitable current to flow into the transistor $Q_{41}$. Accordingly, the output voltage $V_o$ is made stable.

FIG. 2(b) shows a circuit in which a supply voltage $V_{cc}$ is supplied to the collector and base of a bipolar transistor $Q_{42}$ directly and through a resistor $R_{44}$ respectively so that an output voltage $V_o$ is taken out from the emitter of the bipolar transistor $Q_{42}$. The output voltage $V_o$ is supplied to the anode of a diode D through a resistor $R_{45}$, the anode of the diode D being connected to the respective bases of bipolar transistors $Q_{43}$ and $Q_{44}$. The output voltage $V_o$ is supplied to both the respective collectors of the transistors $Q_{43}$ and $Q_{44}$ through a common resistor $R_{46}$, and an earth level is supplied to both the respective emitters of the transistors $Q_{43}$ and $Q_{44}$ through a common resistor 47. Further, the collector of a transistor $Q_{45}$ is connected to the base of the transistor $Q_{42}$, the emitter of the transistor $Q_{45}$ is connected to the earth, and the voltage $V_o$ is supplied to the base of the transistor $Q_{45}$ through the resistor $R_{46}$. In this bias circuit, the anode potential of the diode D changes in accordance with the fluctuation of the $V_o$ so that the currents flowing in the respective transistors $Q_{43}$ and $Q_{44}$ change, and hence the current flowing in the transistor $Q_{45}$ changes as the current flowing in the transistors $Q_{43}$ and $Q_{44}$ changes, whereby the voltage $V_o$ is made stable.

Further, FIG. 3 shows a circuit in which a supply voltage $V_{cc}$ is lowered by a resistor $R_{48}$ so as to obtain an output voltage $V_o$. That is, the voltage $V_o$ is detected by a sense amplifier 41, and an output $V_2$ in accordance with the fluctuation of the detected voltage is supplied to a current source 42 connected between a resistor R and the earth to thereby change a current value. Specifically, the circuit is of a negative feedback type in which when the voltage $V_o$ becomes high, the output $V_2$ becomes high, so that an $I_o$ becomes high to thereby lower the $V_o$ to the original value. Accordingly, although the negative feedback operation is generated also against the fluctuation of the $V_{cc}$ so as to make it possible reduce the fluctuation of the output voltage $V_o$, the fluctuation can not be suppressed to zero. Because the ratio of the fluctuation of the $V_{cc}$ to the fluctuation of the $V_o$ is determined based on the gain of the sense amplifier 41, the ratio of fluctuation can be made small by making the gain large. If the gain is made high, however, there is a risk of occurrence of oscillation. Then, although it is considered to provide a capacitor in the circuit to suppress the oscillation, not only the provision of such a capacitor brings an increase of the area an IC chip but there is a case where such a capacitance can not be formed depending on the size thereof.

Thus, the conventional constant-current regulated power circuits have a problem in that the output voltage $V_o$ of the bias circuit fluctuates in accordance with the supply voltage $V_{cc}$, for example, practically, when the $V_{cc}$ fluctuates by 1 V, the bias voltage $V_o$ fluctuates by about 50 mV. Further, if it is desired that the circuit for suppressing the fluctuation is realized, there has been a problem in that the scale of the circuit becomes large-scaled.

SUMMARY OF THE INVENTION

It is therefore an object of the present invention to provide a constant-current regulated power circuit which is not large in scale and which can suppress the fluctuation of an output of the included bias circuit depending on a supply voltage.

According to the present invention, the constant-current regulated power circuit comprises: a bias circuit connected to first and second voltage sources for sending out a predetermined output voltage; and a transistor (FET) having a base (gate) connected to an output terminal of the bias circuit, an emitter (source) connected to the first and second voltage sources through first and second resistors respectively, and a collector (drain) being made to be an output terminal.

BRIEF DESCRIPTION OF THE DRAWINGS

FIG. 3 is a view of the configuration of an embodiment of the constant-current regulated power circuit according to the present invention;

DETAILED DESCRIPTION OF THE PREFERRED EMBODIMENTS

Figure 1:
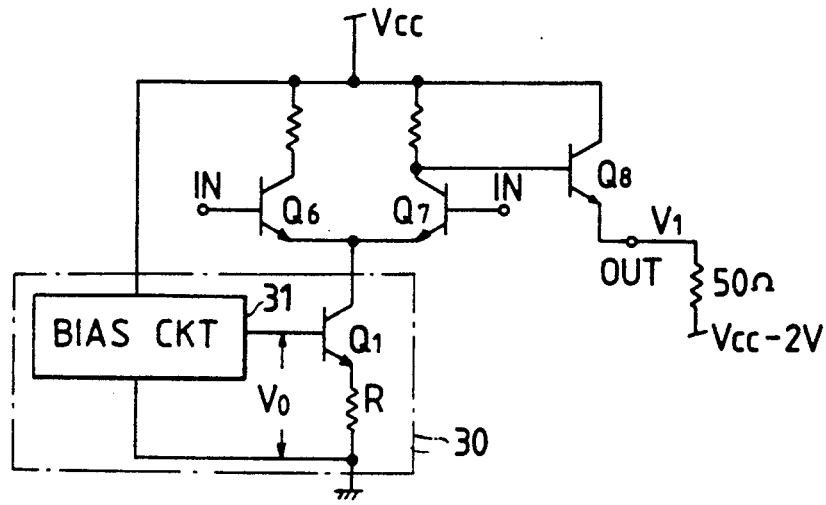
FIG. 1 is a view of the configuration of the differential amplifier circuit using a conventional constant-current regulated power circuit.
Figure 2A:
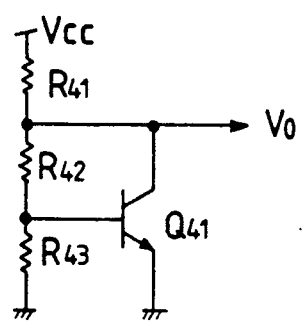
FIGS. 2 and 3 are views of the configurations of conventional constant-current regulated power circuits, respectively.
Figure 2B:
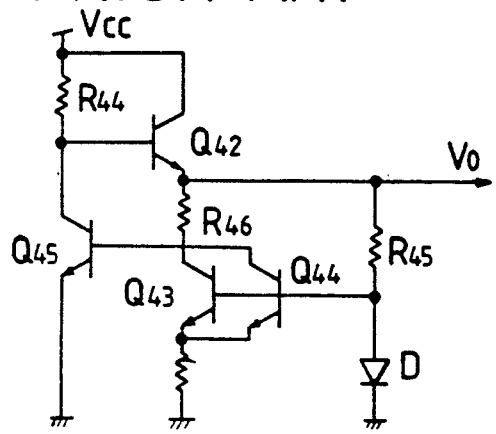
Figure 3:
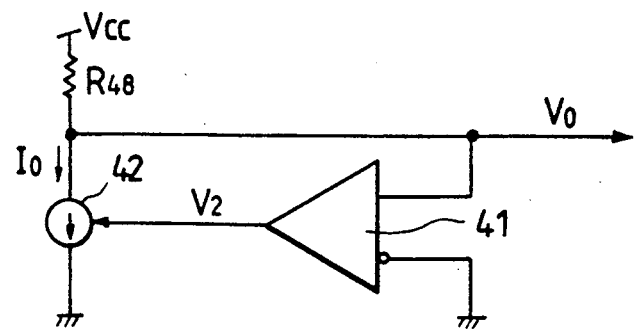

Let an output voltage of a bias circuit 10 in FIG. 4 be represented by $V_o$, the $V_o$ is expressed as follows.

$$V_o = V_o + k\Delta V_{cc} \quad (3)$$

where $\Delta V_{cc}$ represents the quantity of fluctuation of $V_{cc}$. On the other hand, a current I flowing in a transistor $Q_1$ is expressed as follows.

$$I = (-V_{cc}/r) + (1/R + 1/r)(V_o - V_{BE}) \quad (4)$$

Then, assume that $V_{cc} = V^o{}_{cc} + \Delta V_{cc}$. If the equation (3) is substituted in the equation (4), $$I = (-V^o{}_{cc}/r) + (1/R + 1/r) + \Delta V_{cc}[(k-1)/r + k/R] \quad (5)$$

Accordingly, in order to suppress the fluctuation of the current I against on the fluctuation of the $V_{cc}$, it will do to make small a factor by which the $\Delta V_{cc}$ is multiplied in the equation (5), and in order to make the fluctuation of the $V_o$ zero it will do to select the respective values of the resistors R and r so that the following equation is established.

$$R/r = k/(1-k) \quad (6)$$

Figure 4:
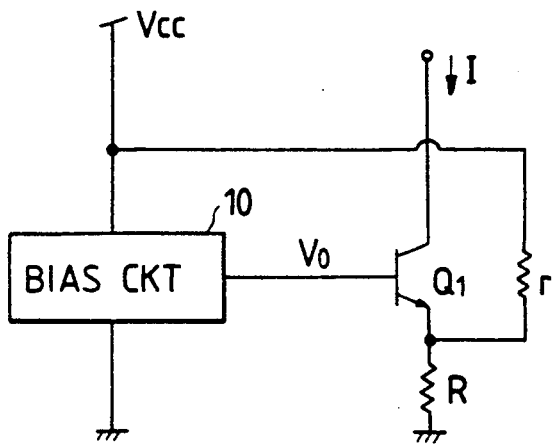
Figure 5:
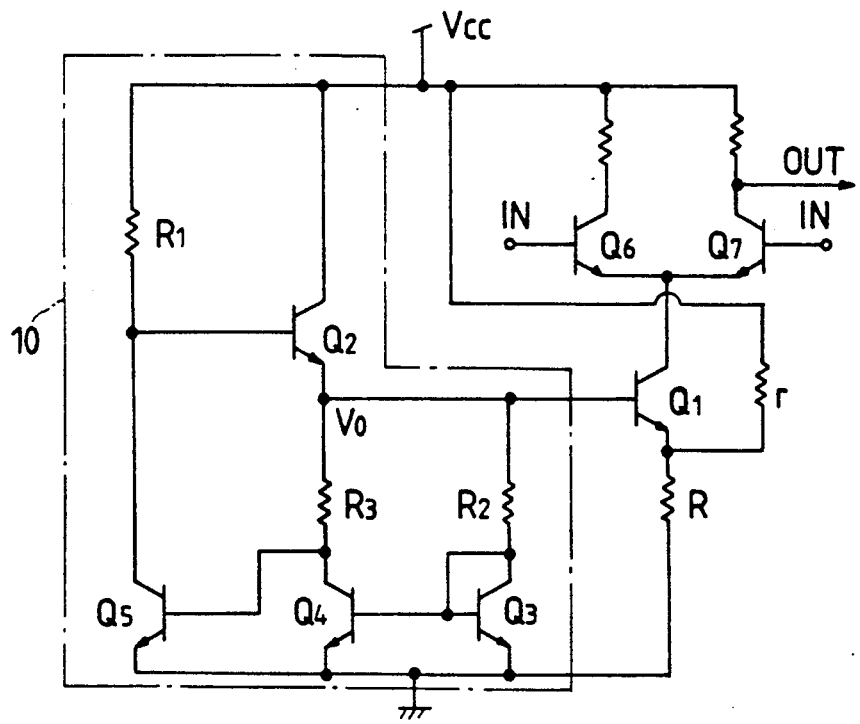
FIG. 5 is a view of the configuration of the differential amplifier circuit using the constant-current circuit which is a more specific embodiment of the present invention.

Referring to FIGS. 4 and 5 of the accompanying drawings, an embodiment of the present invention will be described in detail hereunder.

FIG. 4 shows an embodiment of the constant-current regulated power circuit according to the present invention, as an example in which a transistor $Q_1$ is of an npn-type. A $V_{cc}$ is supplied from a first voltage source $V_{cc}$ to a bias circuit 10, and an earth level is supplied from a second voltage source (the earth) to the bias circuit 10, so that the transistor $Q_1$ produces an output voltage $V_o$ on the basis of the $V_{cc}$ and the earth level. The base of the transistor $Q_1$ is supplied with an output voltage of the bias circuit 10, the emitter of the transistor $Q_1$ is connected to the first voltage source through a first resistor r and to the second voltage source through a second resistor R, and the collector of the transistor $Q_1$ is made to be an output terminal through which a constant current I flows.

Here, with respect to the output voltage $V_o$ in the case of only the bias circuit 10, k as expressed in the equation (3) is obtained. That is, the $V_{cc}$ is made to fluctuate so that a proportional constant k of the quantity of the fluctuation and a fixed value $V_o$ are obtained. Taking the equation (5) into consideration, design is performed on the basis of the temperature characteristic required for the bias circuit 10. That is, by desirably selecting a factor by which the &$V_{cc}$ is multiplied, necessary dependency on the $V_{cc}$ fluctuation can be obtained. When the values of the first and second resistors r and R are selected so that the equation (6) is established, the dependency on the $V_{cc}$ can be eliminated.

FIG. 5 shows an example in which the embodiment of the constant-current regulated power circuit according to the present invention is used in a differential amplifier circuit of an ECL.

In this embodiment, a transistor $Q_2$ is used as the bias circuit 10. The $V_{cc}$ is to the collector and base of the transistor $Q_2$ directly and through a resistor $R_1$ respectively, so that the $V_o$ is taken out from the emitter of the transistor $Q_2$. The fluctuation of the output voltage $V_o$ is caught by use of a current Miller constituted by transistors $Q_3$ and $Q_4$ connected to the emitter of the transistor $Q_2$ through resistors $R_2$ and $R_3$ respectively, and a current flowing in a transistor $Q_5$ is controlled by a current flowing in the transistor $Q_4$ so as to stabilize the output voltage $V_o$.

The other elements constituting the constant-current regulated power circuit are the same as those in FIG. 4. A constant current is made to flow from the respective emitters of a pair of transistors $Q_6$ and $Q_7$ into a transistor $Q_1$, and a differential output is obtained from the collector of the transistor $Q_7$. In the circuit, in spite of the fluctuation of the $V_{cc}$, the output voltage of the bias circuit 10 is stable, so that a stable constant current flows from the differentially amplifying transistors $Q_6$ and $Q_7$ into the transistor $Q_1$.

The present invention is not limited to the above embodiments and but can be variously modified.

Figure 6:
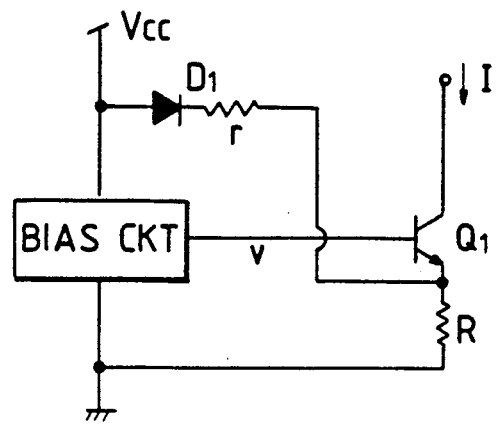
FIGS. 6 through 8 are modified embodiments of the present invention, respectively.

For example, as shown in FIG. 6, a circuit element such as a diode D1 may be connected between the first voltage source $V_{cc}$ and the first resistor r shown in FIG. 4 so that the temperature characteristic of the constant current I can be changed. In this case, when n pieces of the diodes D1 are connected in series therebetween, if the voltage developed between the diodes D1 and the transistor Q1 is represented by VBE, I = I0 − (1/R + 1/r)VBE in the case where the diode D1 exists, I = I0 − {1/R + (1−n)/r}VBE in the case where no diode D1 exists.

Accordingly, the sign of the constant current I can be changed or the constant current I can be adjusted with respect to the temperature change of the voltage VBE if the diode D1 is provided.

Figure 7:
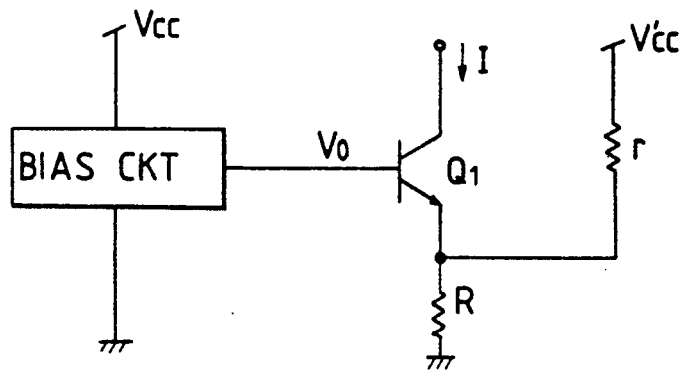

Also, the construction of FIG. 4 is presented by that of FIG. 7 if the voltage sources $V_{cc}$ and $V_{cc}$ cooperate with each other.

Figure 8:
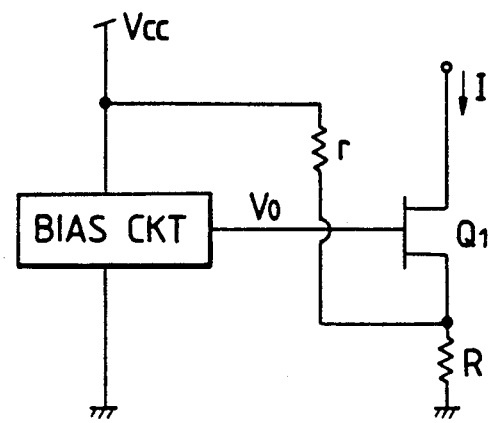

For example, the transistor $Q_1$ may be of the pnp-type. In that case, the emitter is connected to a positive (a second) voltage source through a second resistor R and to a negative (a first) power source through a first resistor r. Further, a bipolar transistor may be substituted for the transistor $Q_1$ so as to use an FET (an electric field transistor) as shown in FIG. 8. In this case, the base, emitter, and collector correspond to the gate, source, and drain respectively.

Figure 9A:
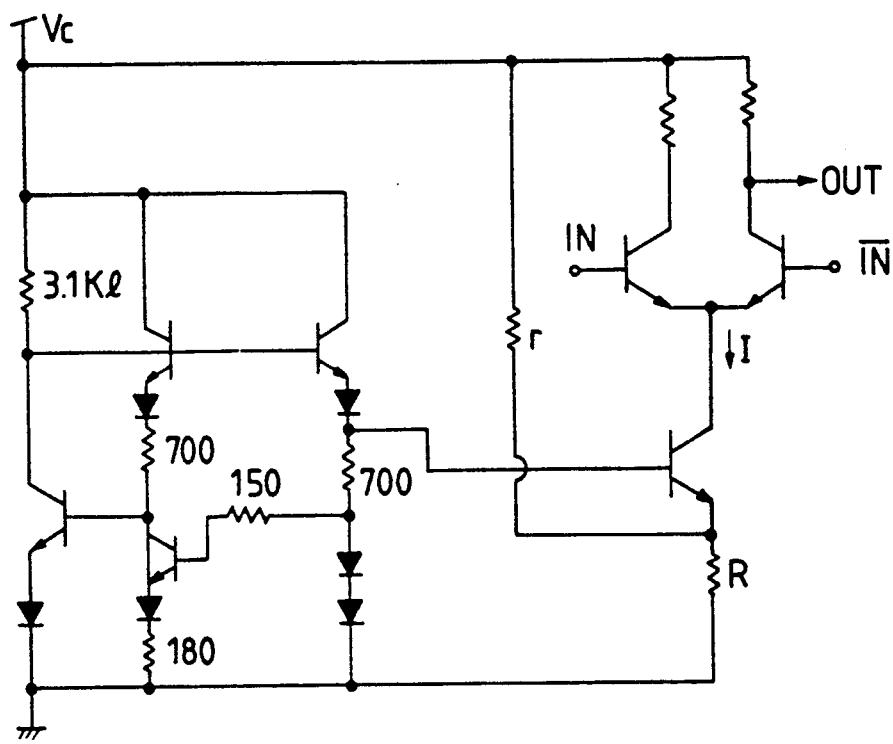
FIGS. 9A and 9B are an example of the constant-current regulated power circuit of FIG. 5, and the relationship between I and Vc, respectively.
Figure 9B:
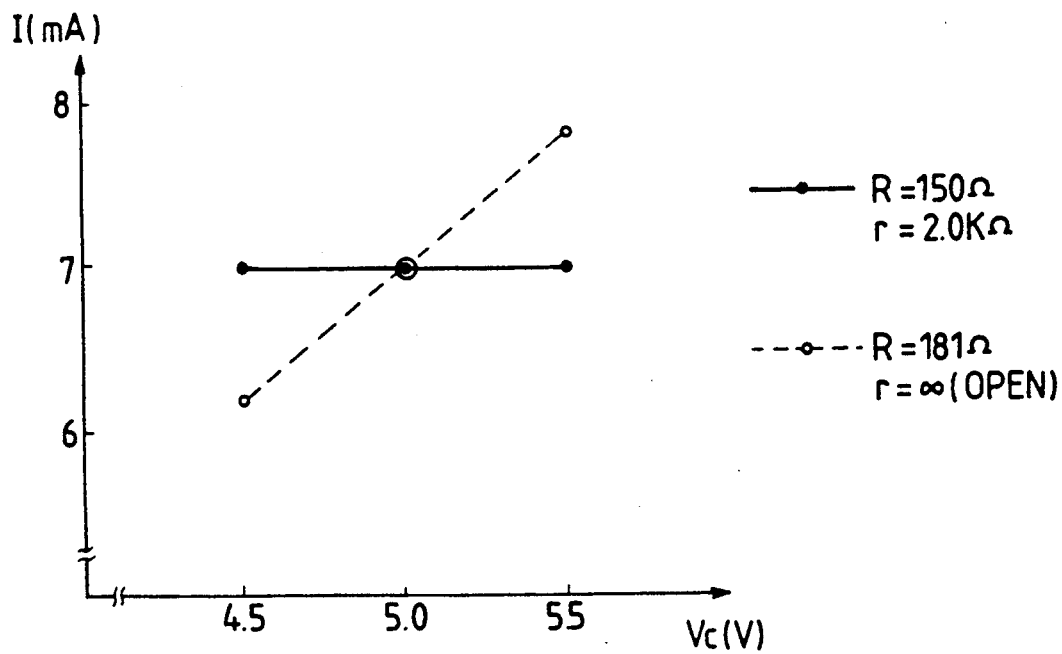

FIG. 9A shows an example of the diferential amplifier circuit using the constant-current circuit according to the present invention, and FIG. 9B shows the results obtained from the example.

As described above, according to the present invention, the output fluctuation of the bias circuit depending on the fluctuation of the supply voltage can be absorbed through the connection relation between the transistors and the resistors, so that the circuit scale is not made large and stable constant-current operation can be assured.

What is claimed is:

1. A constant current regulated power circuit, comprising:
   a first voltage source;
   a second voltage source;
   a third voltage source which cooperates with said first voltage source;
   a bias circuit connected to said first and second voltage sources for sending out a predetermined output voltage, said bias circuit having an output terminal;
   a first resistor;
   a second resistor; and
   a transistor having a base connected to the output terminal of said bias circuit, an emitter connected to said third voltage source through said first resistor and to said second voltage source through said second resistor, respectively, and a collector operating as an output terminal.

2. A circuit as claimed in claim 1, wherein said third voltage source comprises said first voltage source.

3. A circuit as claimed in claim 1, further comprising at least one diode which is connected between said first voltage source and said first resistor.

4. A constant-current regulated power circuit, comprising:
   a first voltage source;
   a second voltage source;
   a third voltage source which cooperates with said first voltage source;
   a bias circuit connected to said first and second voltage sources for sending out a predetermined output voltage, said bias circuit having an output terminal;
   a first resistor;
   a second resistor; and
   a transistor having a gate connected to the output terminal of said bias circuit, a source connected to said third voltage source through said first resistor and to said second voltage source through said second resistor, respectively, and a drain operating as an output terminal.

5. A circuit as claimed in claim 4, wherein said third voltage source comprises said first voltage source.

6. A circuit as claimed in claim 4, further comprising at least one diode which is connected between said first voltage source and said first resistor.

* * * * *